(12) United States Patent
Hanaoka

(10) Patent No.: US 7,605,464 B2
(45) Date of Patent: Oct. 20, 2009

(54) SEMICONDUCTOR DEVICE

(75) Inventor: Terunao Hanaoka, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/015,762

(22) Filed: Jan. 17, 2008

(65) Prior Publication Data

US 2008/0174014 A1 Jul. 24, 2008

(30) Foreign Application Priority Data

Jan. 19, 2007 (JP) ............... 2007-010573

(51) Int. Cl.
*H01L 23/12* (2006.01)
(52) U.S. Cl. ............... 257/700; 257/758; 257/E23.068; 257/E23.069
(58) Field of Classification Search ................. 257/211, 257/758, 759, 669, 673, 692, 700, 737, E23.068, 257/E23.069
See application file for complete search history.

(56) References Cited

U.S. PATENT DOCUMENTS 6,940,160 B1 9/2005 Hanaoka et al.
7,132,742 B2 11/2006 Yamaguchi
7,298,042 B2 11/2007 Yamaguchi
2007/0126030 A1* 6/2007 Ito ............................. 257/211
2008/0042259 A1 2/2008 Yamaguchi

FOREIGN PATENT DOCUMENTS

| JP | 11-297873 | 10/1999 |
|---|---|---|
| JP | 2001-244360 | 9/2001 |
| JP | 2003-232790 | 10/2003 |
| JP | 2004-104102 | 4/2004 |
| WO | WO00/55898 | 9/2000 |

* cited by examiner

*Primary Examiner*—Quoc D Hoang
(74) *Attorney, Agent, or Firm*—Harness, Dickey & Pierce, P.L.C.

(57) ABSTRACT

A semiconductor device includes: a semiconductor substrate having an integrated circuit formed thereon and an electrode electrically coupled to the integrated circuit; a passivation film formed on a surface of the semiconductor substrate, the surface having the electrode formed thereon; a first metal layer formed so as to come into contact with the passivation film; a resin layer formed on the first metal layer; a wiring formed so as to be electrically coupled to the electrode and reach an upper surface of the resin layer; and a second metal layer formed so as to be in contact with the first metal layer and reach the upper surface of the resin layer.

5 Claims, 5 Drawing Sheets

SEMICONDUCTOR DEVICE

The entire disclosure of Japanese Patent Application No.2007-010573, filed Jan. 19, 2007 is expressly incorporated by reference herein.

BACKGROUND OF THE INVENTION

1. Technical Field

The present invention relates to a semiconductor device.

2. Related Art

Recently, a packaging called wafer-level CSP is being developed, in which a wiring is formed on a semiconductor chip so as to form an external terminal (see JP-A-2003-282790). Provided under the wiring is a resin layer so that stress generated at the wiring is distributed and absorbed. However, when the surface (active surface), on which an integrated circuit is formed, is covered by the resin layer, heat release performance is deteriorated. Further, the wiring can hardly dissipate heat, because the wiring is covered by a solder mask except a land, on which a solder ball is to be laid. Accordingly, when the semiconductor device is mounted on a mother board, most of heat generated in the integrated circuit is disadvantageously transferred to the mother board intensively on the external terminal. Therefore, there arises an adverse effect due to heat on the mother board.

SUMMARY

An advantage of the present invention is to reduce adverse effect on a mother board by using a resin layer.

(1) A semiconductor device according to the invention includes: a semiconductor substrate having an integrated circuit formed thereon and an electrode electrically coupled to the integrated circuit; a passivation film formed on a surface of the semiconductor substrate, the surface having the electrode formed thereon; a first metal layer formed so as to come into contact with the passivation film; a resin layer formed on the first metal layer; a wiring formed so as to be electrically coupled to the electrode and reach an upper surface of the resin layer; and a second metal layer formed so as to be in contact with the first metal layer and reach the upper surface of the resin layer. According to the invention, the first metal layer comes into contact with the passivation film so as to transfer heat to the second metal layer, thereby making it possible to effectively promote heat loss. Accordingly, when the semiconductor device is mounted on a mother board, adverse effect on the mother board due to heat can be reduced.

(2) In this case, the first metal layer may come, at its entire side opposed to the passivation film, into contact with the passivation film.

(3) In this case, the semiconductor device may further include a second resin layer formed on the passivation film, and the first metal layer may include a portion contacting the passivation film and a portion positioned on the second resin layer.

(4) In this case, the first metal layer may come, only at its end, into contact with the passivation film.

(5) In this case, the first metal layer may come, at least a part of its end, into contact with the passivation film, and a region except the end of the first metal layer may include the portion contacting the passivation film and the portion positioned on the second resin layer.

(6) In this case, the first metal layer having a surface formed in a concavo-convex shape, the surface opposite to another surface thereof facing the passivation film.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described.

First Embodiment

Figure 1:
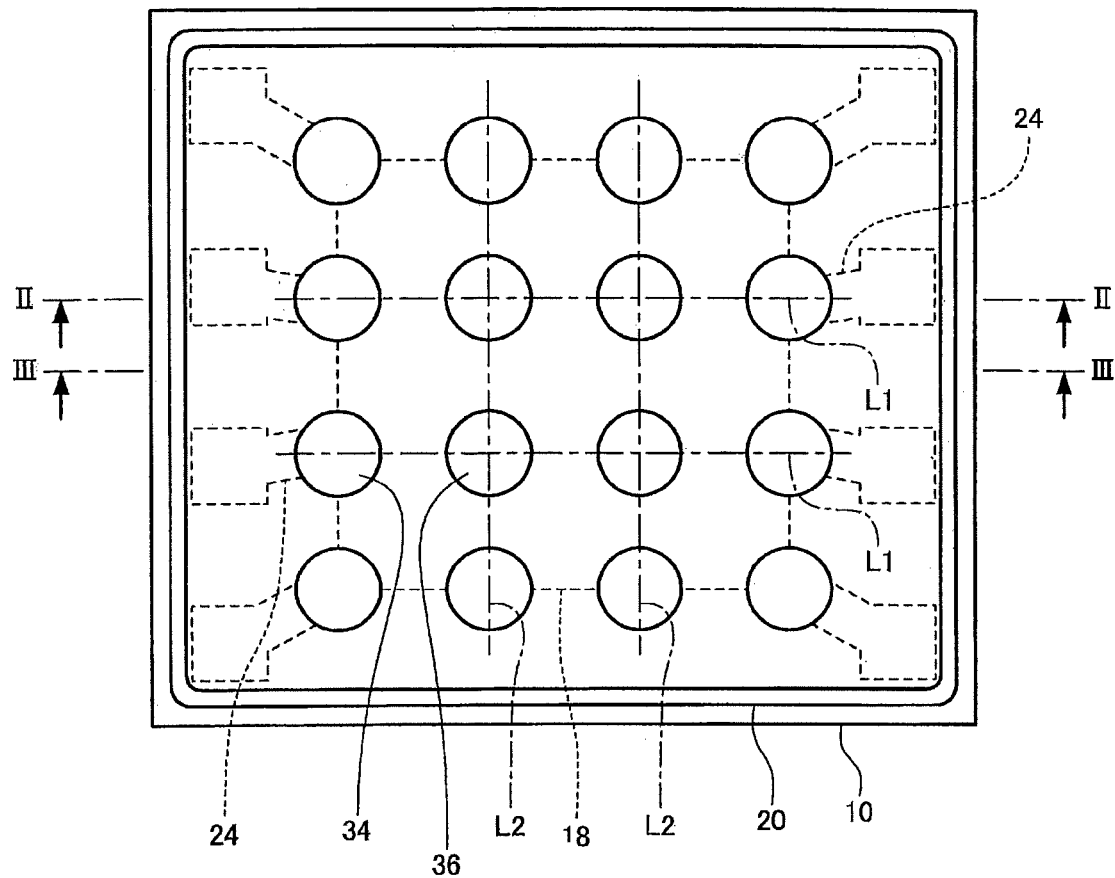
FIG. 1 is a view showing a semiconductor device according to a first embodiment of the invention.
Figure 2:
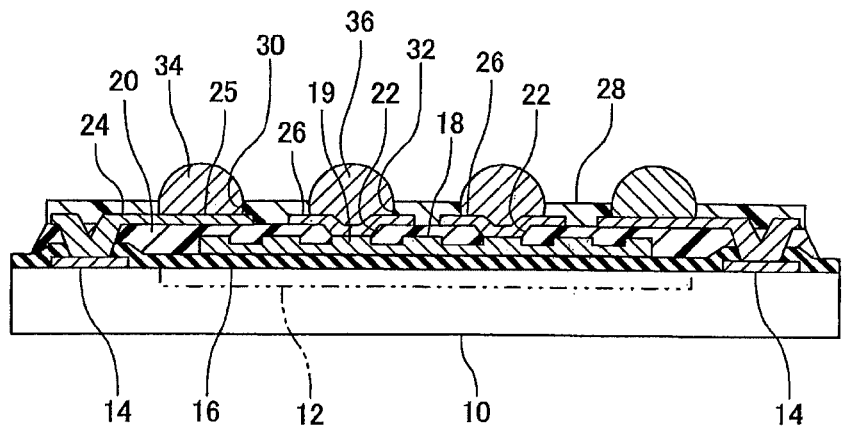
FIG. 2 is a sectional view taken along with the line II-II of the semiconductor device shown in FIG. 1.
Figure 3:
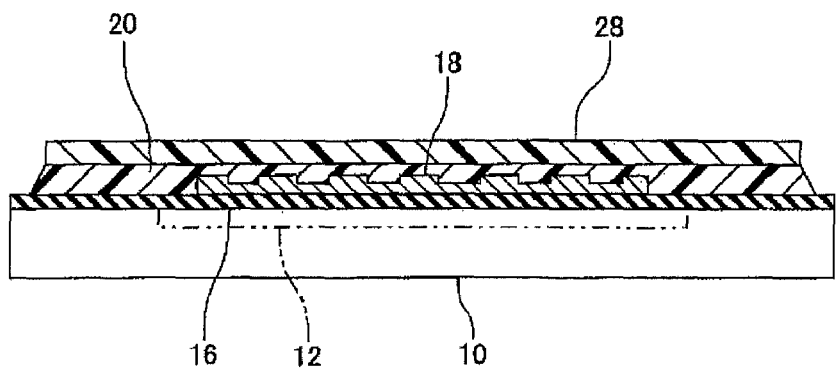
FIG. 3 is a sectional view taken along with the line III-III of the semiconductor device shown in FIG. 1.

FIG. 1 is a view showing a semiconductor device according to a first embodiment of the invention. FIG. 2 is a sectional view taken along the line II-II of the semiconductor device shown in FIG. 1. FIG. 3 is a sectional view taken along the line III-III of the semiconductor device shown in FIG. 1.

The semiconductor device includes a semiconductor substrate 10. As finished product, the semiconductor substrate 10 is a semiconductor chip, as shown in FIG. 1, while the semiconductor substrate 10 is a semiconductor wafer as interim product when in a fabrication process. Provided in the semiconductor substrate 10 is an integrated circuit 12 (there are one integrated circuit 12 in the case of the semiconductor chip shown in FIG. 1 and a plurality of integrated circuits 12 in the case of the semiconductor wafer). The integrated circuit 12 is to be worked in one surface of the semiconductor substrate 10. Provided in each integrated circuit 12 and is a plurality of electrodes 14, which is electrically connected to each integrated circuit 12 via an internal wiring formed in the semiconductor substrate 10. Formed on the surface of the semiconductor substrate 10 having the electrodes 14 formed therein is a passivation film 16 so that at least a part of the electrodes 14 are to be exposed. The passivation film 16 is made from inorganic material (for example, inorganic oxide such as $SiO_2$).

A first metal layer 18 is formed so as to come into contact with the passivation film 16. The first metal layer 18 comes, at its entire side (for example, the flat side) opposed to the passivation film 16, into contact with the passivation film 16. As shown in FIG. 2, the side of the first metal layer 18 apart from the passivation film 16 may be uneven or flat. The side of the first metal layer 18 parallel to the passivation film 16 has a polygonal shape (for example, a rectangular shape).

Formed on the first metal layer 18 is a resin layer (stress relaxation layer) 20. The resin layer 20 is formed on the surface (surface of the passivation film 16), in which the electrodes 14 of the semiconductor substrate 10 are formed, except where at least a part of the electrodes 14 exists. When the resin layer 20 is formed except where a cutting line of the semiconductor substrate 10 exists, it becomes possible to avoid clogging of a cutter (or a scriber). The surface (upper side) of the resin layer 20 is roughened by using dry etching, for example. An opening 22 is formed in the resin layer 20. To be more specific, the opening 22 is formed on a projection 19 of the first metal layer 18. It is possible to form the resin layer 20 by applying photolithography using photosensitive resin. Further, the resin layer 20 can be formed by using thermosetting resin.

A wiring 24 is formed so as to electrically connect the electrodes 14 (down from the electrodes 14) and reach the resin layer 20 (its upper surface). When the surface of the resin layer 20 is roughened, the wiring 24 can closely attach, so that the surface, at which the wiring 24 and the resin layer 20 contact each other, takes a shape corresponding to the roughened surface, resulting in that there is wider surface area than that of a flat surface. The wiring 24 may be formed on (be in contact with) the passivation film 16 between the electrodes 14 and the resin layer 20.

A second metal layer 26 is formed so as to reach the resin layer 20 (its upper surface) while being in contact with the first metal layer 28. The second metal layer 26 is in contact with (is bonded to) the first metal layer 18 though the opening 22 of the resin layer 20. The second metal layer 26 may be formed by the same material as the wiring 24 or at the same time with the wiring 24. The second metal layer 26 is not electrically connected to the wiring 24. The second metal layer 26 is not electrically connected to the integrated circuit 12.

Formed on the resin layer 20 is a solder mask layer 28. The solder mask layer 28 is laid on the wiring 24 and the second metal layer 26. Provided in the solder mask layer 28 are a first through-hole 30 overlapping the wiring 24 (a land 25, which is a part of the wiring) and a second through-hole 32 for exposing a part of the second metal layer 26. The second through-hole 32 is provided at such a portion that does not make the resin layer 20 expose. In other words, the second metal layer 26 is positioned at the entire inner surface of the second through-hole 32.

An external terminal 34 is provided within the first through-hole 30 and on the wiring 24. The external terminal 34 is a terminal (signal terminal or power supply terminal) to be electrically connected to the integrated circuit 12. The external terminal 34 may be formed by soldering. For example, a cream solder may be provided on the wiring 24 (land 25) and then molten to be formed like a ball by utilizing surface tension.

A metal terminal 36 is provided within the second through-hole 32 and on the second metal layer 26. The metal terminal 36 (signal terminal or power supply terminal) is not electrically connected to the integrated circuit 12. Therefore, the metal terminal 36 may be a dummy terminal. The metal terminal 36 may be formed by the same material as the external terminal 34 or have the same shape thereof. A plurality of metal terminals 36 (and/or a plurality of external terminals) are positioned at a plurality of intersections of a plurality of first straight lines $L_1$ parallel to each other and a plurality of second straight lines $L_2$ parallel to each other, which are orthogonal to the plurality of first straight lines $L_1$, in a manner that the distance between the neighboring rows along each of the first and second straight lines L1, L2 is the same.

When the semiconductor substrate 10 is a semiconductor wafer, it can be cut (subjected to dicing or scribing), thereby achieving a semiconductor device.

According to this embodiment of the invention, the first metal layer 18 transfers heat to the second metal layer 26 such that it comes into contact with the passivation film 16. Since the metal terminal 36 is provided in the second metal layer 26, heat can be transferred to the metal terminal 36. Thus, it is possible to promote heat loss effectively, so when the semiconductor device is mounted on the mother board, the adverse effect on the mother board due to heat can be reduced.

Second Embodiment

Figure 4:
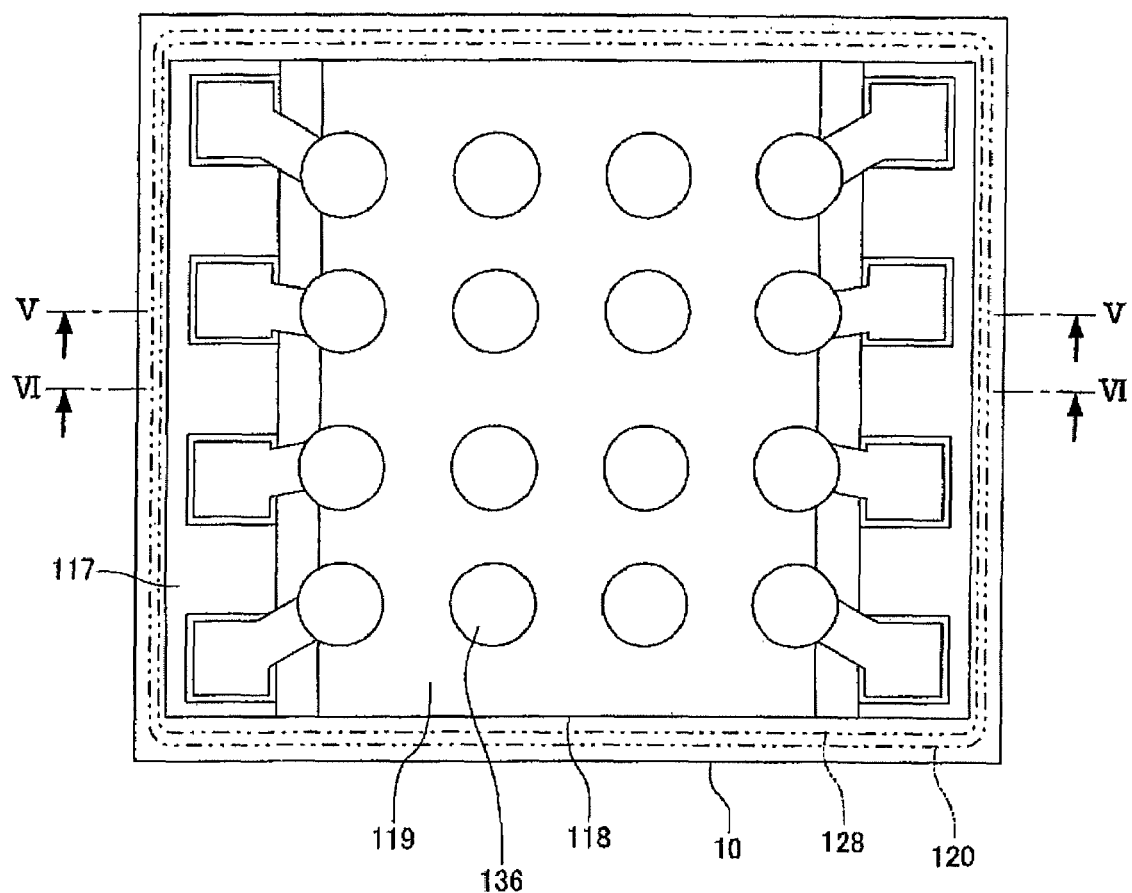
FIG. 4 is a view showing a semiconductor device according to a second embodiment of the invention.
Figure 5:
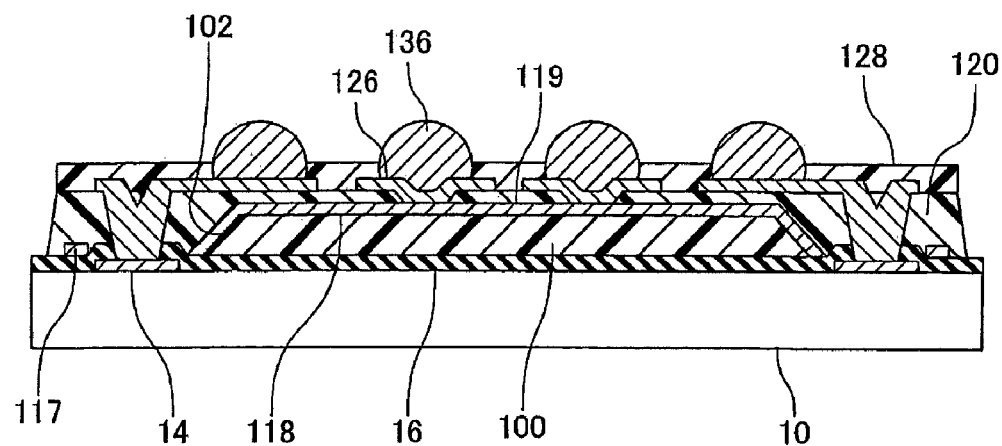
FIG. 5 is a sectional view taken along with the line V-V of the semiconductor device shown in FIG. 4.
Figure 6:
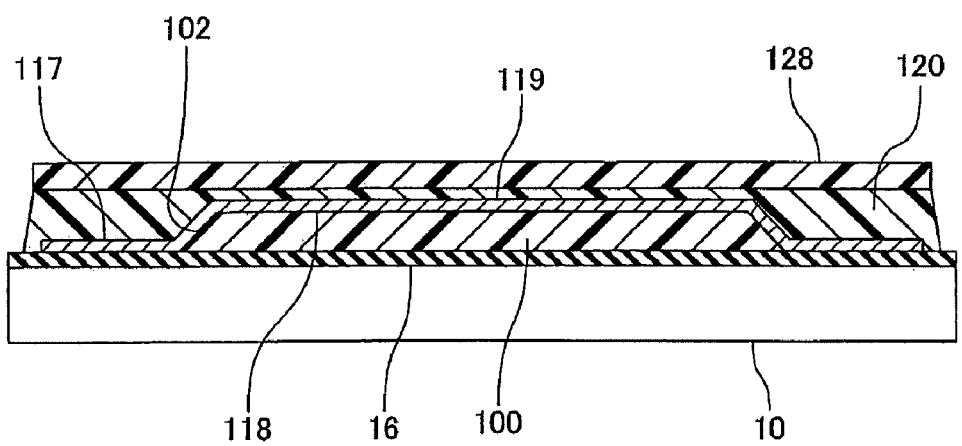
FIG. 6 is a sectional view taken along with the line VI-VI of the semiconductor device shown in FIG. 4.

FIG. 4 is a view showing a semiconductor device according to a second embodiment of the invention. FIG. 5 is a sectional view taken along with the line V-V of the semiconductor device shown in FIG. 4. FIG. 6 is a sectional view taken along with the line VI-VI of the semiconductor device shown in FIG. 4.

According to this embodiment of the invention, a second resin layer 100 is provided on the passivation film 16. The second resin layer 100 can be formed by using photolithography with the use of photosensitive resin. It is also possible to form the second resin layer 100 by using thermosetting resin. The second resin layer 100 can be inclined at its lateral surface 102 so that the lateral surface 102 makes an acute angle with the bottom surface of the second resin layer. The inclination of the lateral surface 102 can be made by thermal contraction of thermosetting resin precursor.

The first metal layer 18 includes a portion 117 contacting the passivation film 16 and a portion 119 positioned on the second resin layer 100. The first metal layer 118 may be in contact with the passivation film 16 only at its ends. Provided on the portion 119 of the first metal layer 18 positioned on the second resin layer 100 is a second metal layer 126, on which a metal terminal 136 is provided.

The contents explained with reference to the above-mentioned first embodiment of the invention can also be applied to further constructions and fabricating methods. For example, it is also possible to apply the contents regarding to the resin layer 20 and the solder mask layer 28 to a resin layer 120 and a solder mask layer 128. Therefore, also in the case of this embodiment of the invention, it is possible to effectively promote heat loss.

Third Embodiment

Figure 7:
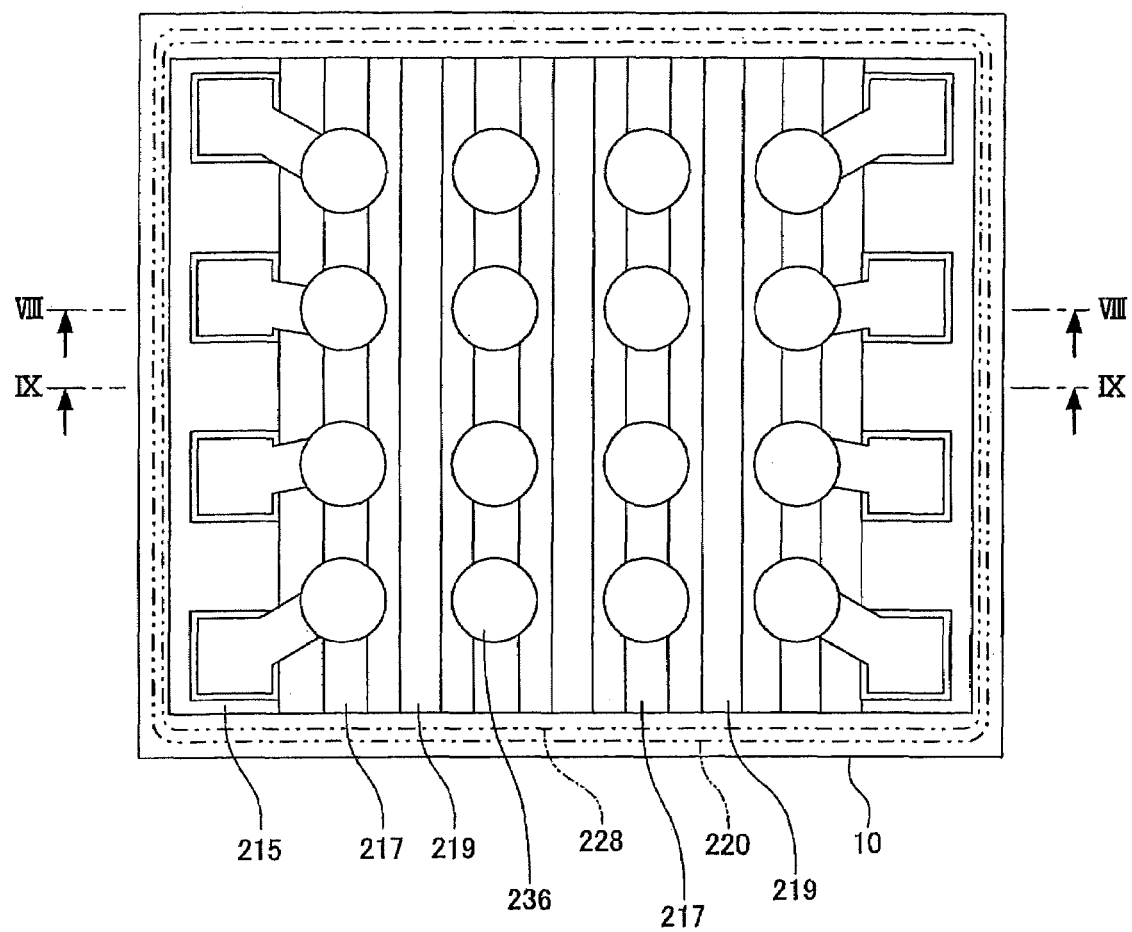
FIG. 7 is a view showing a semiconductor device according to a third embodiment of the invention.
Figure 8:
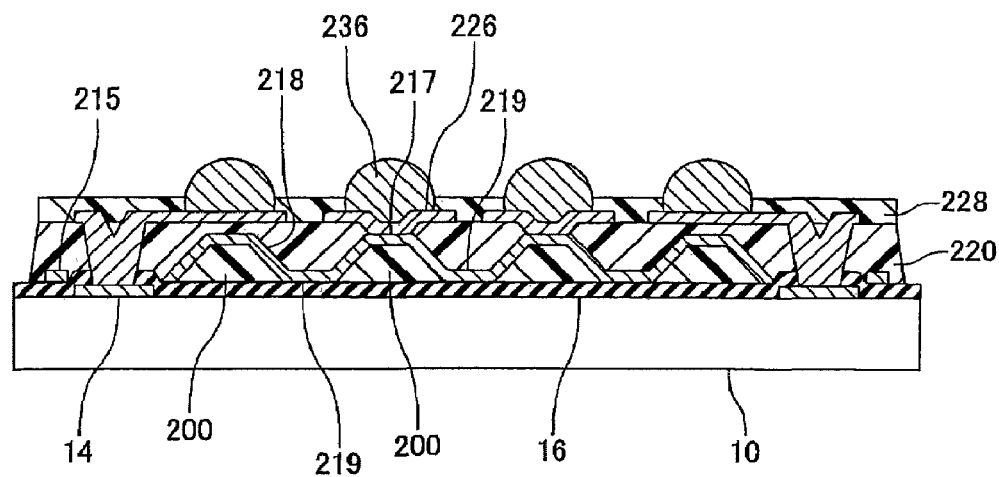
FIG. 8 is a sectional view taken along with the line VIII-VIII of the semiconductor device shown in FIG. 7.
Figure 9:
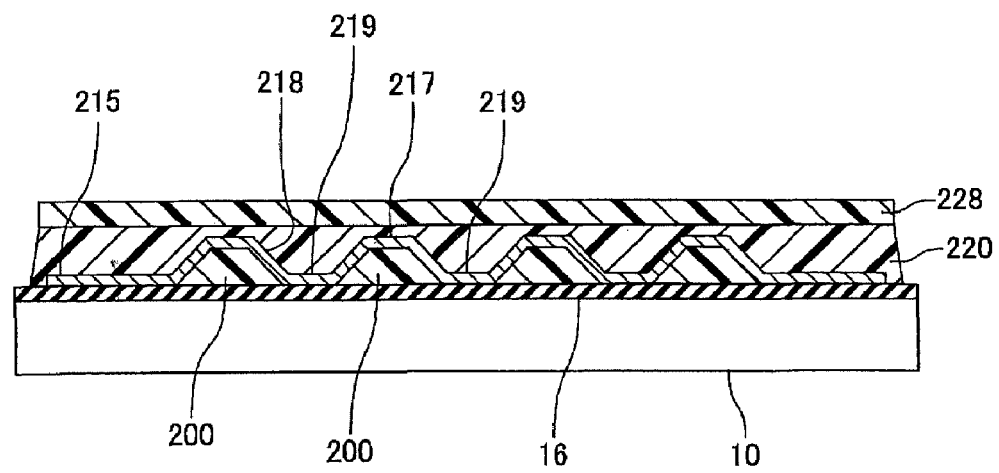
FIG. 9 is a sectional view taken along with the line IX-IX of the semiconductor device shown in FIG. 7.

FIG. 7 is a view showing a semiconductor device according to a third embodiment of the invention. FIG. 8 is a sectional view taken along with the line VIII-VIII of the semiconductor device shown in FIG. 7. FIG. 9 is a sectional view taken along with the line IX-IX of the semiconductor device shown in FIG. 7.

According to this embodiment of the invention, provided on the passivation film 16 is a second resin layer 200. The second resin layer 200 may be, as shown in FIG. 8 and FIG. 9, divided into a plurality of portions, have just a through-hole and be not separated, or have a projection, which does not extending therethrough. In all the cases, the upper surface of the second resin layer 200 is made uneven.

A first metal layer 218 includes portions 215, 219 contacting the passivation film 16 and a portion 217 positioned on the second resin layer 200. The first resin layer 218 is in contact with the passivation film 16 at a part of a end 215 (at the entire peripheral portion or a part thereof). The region except the end 215 of the first metal layer 218 may include a portion 217 positioned on the second resin layer 200 and further a portion 219 contacting the passivation film 16. In this case, both of the upper surface and the lower surface of the first metal layer 218 made uneven in accordance with the unevenness of the upper surface of the second resin layer 200, thereby making it possible to obtain wider surface area. Provided on the portion 217 of the first metal layer 218 on the second resin layer 200 is a second metal layer 226, on which a metal terminal 236 is provided.

The contents explained with reference to the above-mentioned first embodiment of the invention can also be applied to further constructions and fabricating methods. For example, it is also possible to apply the contents regarding to the resin layer 20 and the solder mask layer 28 to a resin layer 220 and a solder mask layer 228. Therefore, also in the case of this embodiment of the invention, it is possible to effectively promote heat loss.

While particular embodiments of the present invention have been illustrated and described above, it is to be understood that the invention is not limited to the above-mentioned embodiments and that various changes are possible. For example, the invention includes substantially the same construction as the construction with reference to the above-mentioned embodiments (for example, construction, according to which the same function, method and result are to be obtained or construction whose object and result are the same). Also, the present invention includes compositions in which portions not essential in the compositions described in the exemplary embodiment are replaced with others. Also, the present invention includes compositions that achieve the same or similar functions and effects or achieve the same or similar advantages as those of the compositions described in the exemplary embodiment. Furthermore, the present invention includes compositions that include related art or known technology added to the compositions described in the exemplary embodiment.

What is claimed is:

1. A semiconductor device, comprising:
    a semiconductor substrate that has an integrated circuit and an electrode electrically coupled to the integrated circuit;
    a passivation film that is formed on a surface of the semiconductor substrate, the electrode being formed on the surface of the semiconductor substrate;
    a first metal layer that is formed so as to come into contact with the passivation film;
    a first resin layer that is formed on the first metal layer;
    a wiring that is formed so as to be electrically coupled to the electrode and reach an upper surface of the first resin layer;
    a second metal layer that is formed so as to be in contact with the first metal layer and reach the upper surface of the first resin layer; and
    a second resin layer that is formed on the passivation film, wherein the first metal layer includes a portion contacting the passivation film and a portion positioned on the second resin layer.

2. The semiconductor device according to claim 1, only an end of the first metal layer coming into contact with the passivation film.

3. The semiconductor device according to claim 1, wherein:
    at least a part of an end of the first metal layer comes into contact with the passivation film; and
    a region except the end of the first metal layer includes a portion contacting the passivation film and the portion positioned on the second resin layer.

4. The semiconductor device according to claim 1, the first metal layer having a surface formed in a concavo-convex shape, the surface opposite to another surface thereof facing the passivation film.

5. A semiconductor device, comprising:
    a semiconductor substrate that has an integrated circuit and an electrode electrically coupled to the integrated circuit;
    a passivation film that is formed on a surface of the semiconductor substrate, the electrode being formed on the surface of the semiconductor substrate;
    a first metal layer that is formed so as to come into contact with the passivation film, the first metal layer having a surface formed in a concavo-convex shape, the surface opposite to another surface thereof facing the passivation film
    a resin layer that is formed on the first metal layer;
    a wiring that is formed so as to be electrically coupled to the electrode and reach an upper surface of the resin layer; and
    a second metal layer that is formed so as to be in contact with the first metal layer and reach the upper surface of the resin layer.

* * * * *